(12) United States Patent
Luz et al.

(10) Patent No.: US 6,321,073 B1
(45) Date of Patent: Nov. 20, 2001

(54) RADIOTELEPHONE RECEIVER AND METHOD WITH IMPROVED DYNAMIC RANGE AND DC OFFSET CORRECTION

(75) Inventors: Yuda Y. Luz, Buffalo Grove, IL (US); Ariel Luzzatto, Holon (IL); Dean E. Thorson, Hoffman Estates, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/495,162

(22) Filed: Jan. 31, 2000

(51) Int. Cl.[7] .............................. H04B 1/06; H04B 7/00; H03G 3/10; H03G 3/18; H03G 3/30
(52) U.S. Cl. ...................... 455/239.1; 455/234.1; 455/232.1; 455/251.1; 330/278
(58) Field of Search .................... 455/232.1, 234.1, 455/234.2, 235.1, 236.1, 239.1, 240.1, 241.1, 245.1, 245.2, 249.1, 251.1, 252.1, 253.2; 330/129, 131, 278, 279, 284, 285; 375/345, 317, 319

(56) References Cited

U.S. PATENT DOCUMENTS

| | | | |
|---|---|---|---|
| 5,083,304 | * | 1/1992 | Cahill ............................... 455/239.1 |
| 5,184,349 | * | 2/1993 | Riordan ............................. 455/234.1 |
| 5,222,144 | * | 6/1993 | Whikehart .............................. 381/15 |
| 5,422,909 | * | 6/1995 | Love et al. ............................ 375/147 |
| 5,469,115 | * | 11/1995 | Peterzell et al. ................... 455/240.1 |
| 5,812,025 | * | 9/1998 | Shimazaki .......................... 455/234.2 |
| 5,867,063 | * | 2/1999 | Snider et al. ...................... 455/241.1 |
| 5,896,064 | * | 4/1999 | Kaku .................................. 455/241.1 |
| 6,064,193 | * | 5/2000 | Hansen et al. ....................... 324/132 |

* cited by examiner

Primary Examiner—Nay Maung
Assistant Examiner—Raymond Persino
(74) Attorney, Agent, or Firm—Sayed Hossain Beladi; Lalita P. Williams

(57) ABSTRACT

An automatic gain control apparatus (106) and method for a radiotelephone receiver employs stored inverse transfer function data (400) of the radiotelephone receiver and a gain estimation circuit (200). The gain estimation circuit (200) estimates the input power of received signal (103) and determines a required gain based on a nonlinear portion of the inverse transfer function data (400) of the radiotelephone receiver to provide an improved dynamic range of the receiver. The apparatus and method performs convergence within one iteration to perform fast gain control. In addition, if desired, a DC offset compensation circuit, such as a feedforward DC offset compensation circuit (202), compensates the digital representation of the input signal for use by the gain estimation circuit (200).

21 Claims, 3 Drawing Sheets

RADIOTELEPHONE RECEIVER AND METHOD WITH IMPROVED DYNAMIC RANGE AND DC OFFSET CORRECTION

FIELD OF THE INVENTION

The invention relates generally to radiotelephone receivers, and more particularly to an automatic gain control apparatus and methods for radiotelephone receivers

BACKGROUND OF THE INVENTION

Radio frequency receivers are well known and have automatic gain control (AGC) circuits that attempt to provide control of one or more gain stages based on the detected input power levels to maintain a relatively constant power level. Accordingly, a large dynamic range of incoming signals is modified, such as attenuated or amplified, to provide a more constant level of signal for processing. Typically, there are two stages of an AGC circuit, an analog stage such as multigain stages, and a digital stage. The digital stage may have an analog/digital converter and other digital circuitry to suitably control the analog gain stages. These two stage AGC circuits have been developed in an attempt to control a gain for time division multiple access (TDMA) signals and some code division multiple access (CDMA) systems.

However, known AGC circuits typically may be too slow to accurately compute and control millions of chips per second of data, such as for CDMA systems. For example, known CDMA type receivers, may have a limited dynamic range that is too small and can be too slow to track input signals that can change quickly. Generally, with CDMA signals, low pass filter time constants of AGC input stages can be too slow to respond in order to suitably capture a low power, fast changing coded signal. In addition, with CDMA receivers, typically a wide band receiver is used that has a bandwidth of one to five MHz. However, such systems typically need to accommodate for fast fading signals over larger frequency ranges since mobile units may be quickly changing power levels depending upon their closeness to a transmitting or receiving station. As known, CDMA systems allow mobile stations to use the same radio frequencies and differing codes. Accordingly, the receivers need to quickly detect varying power levels at the same frequency for different received codes. Also, known AGC circuits control an in-phase and quadrature phase gain substantially independently which can result in code domain degradation. As known, CDMA systems utilize in-phase and quadrature-phase demodulation sub-systems. Imbalances in the gain of these sub-systems create errors in the demodulation process. The ratio of the quadrature signal amplitude to the in-phase amplitude is used to measure the relative phase of the incoming signal; the square root of the total sum of the quadrature power and the in-phase power is used as an amplitude measurement. Any error in the demodulation process degrades the incoming signal measurement quality and this degradation is known as code domain degradation.

In addition, DC offsets introduced, for example, by changes in temperature of the system and leakage of local oscillators, and other known factors, may cause a received signal to exceed the limit of an A/D's high end due to uncorrected DC offset. In addition, when the input signal exceeds the linear range of a receiver, the receiver automatically clips the signal, for example, if a DC offset is received as part of the signal, or truncates a low signal.

Accordingly, a need exists to increase the dynamic range of a radiotelephone receiver using AGC circuits and methods. Such AGC circuits and methods should attempt to have increased speed compared to dual stage receivers to accommodate CDMA input signals and other input signals that have rapidly changing power levels. In addition, DC offset correction should be employed to assist in more accurately controlling gain compensation for received signals.

DETAILED DESCRIPTION OF THE PREFERRED EMBODIMENT

Briefly, an automatic gain control apparatus and method for a radiotelephone receiver employs stored inverse transfer function data of the radiotelephone receiver and a gain estimation circuit. The gain estimation circuit estimates the input power of received signal and determines a required gain based on a nonlinear portion of the inverse transfer function of the radiotelephone receiver to provide an improved dynamic range of the receiver. The apparatus and method performs convergence within one iteration to perform fast gain control. In addition, if desired, a DC offset compensation circuit, such as a feedforward DC offset compensation circuit, compensates the digital representation of the input signal for use by the gain estimation circuit.

Figure 1:
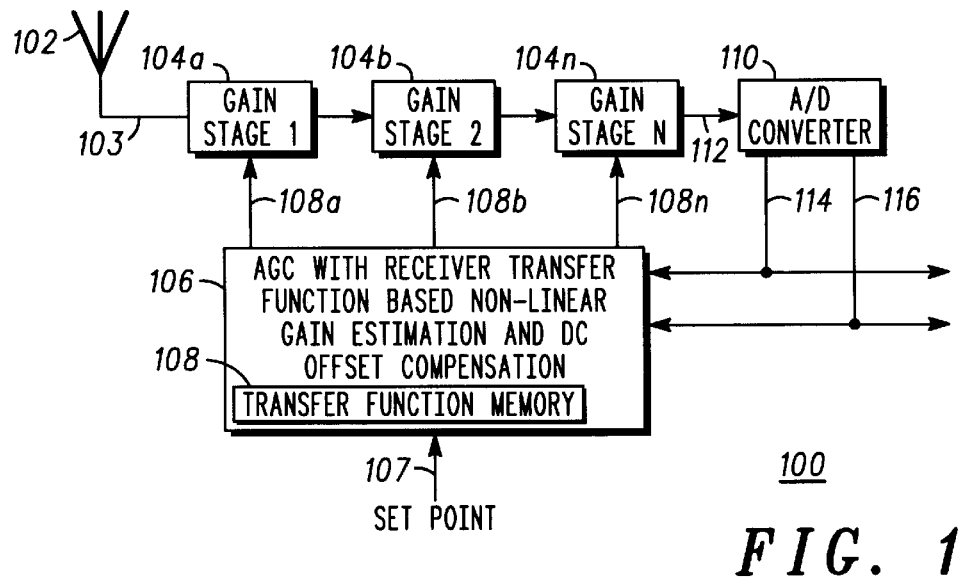
FIG. 1 is block diagram illustrating one example of an automatic gain control apparatus in accordance with one embodiment of the invention.

FIG. 1 illustrates a portion of a radiotelephone receiver 100 having a receiving antenna element 102 for receiving incoming signals, such as CDMA signals, or other suitable signals. The radiotelephone receiver 100 includes a plurality of analog gain stages 104a–104n that are simultaneously controlled by an automatic gain control circuit 106 with receiver transfer function based nonlinear gain estimation, and DC offset compensation. The automatic gain control circuit 106 includes memory 108 containing data representing a transfer function, such as an inverse transfer function of the radiotelephone receiver 100. In addition, the automatic gain control circuit 106 provides gain control signals 108a–108n to the gain stages 104a–104n. An analog to digital (A/D) converter 110 receives gain compensated signal 112 and outputs a digital representation of an in-phase (I) signal 114 and a quadrature phase (Q) signal 116 based on the compensated signal 112 for the AGC circuit 106. The AGC circuit 106 is operative to receive a set point signal 107 as used by the AGC circuit 106 to control the gain stages 104–104n to provide the set point level of the signal 112. The I and Q signals 114 and 116, serve as output to conventional signal processing stages of a radiotelephone receiver as known in the art.

Figure 2:
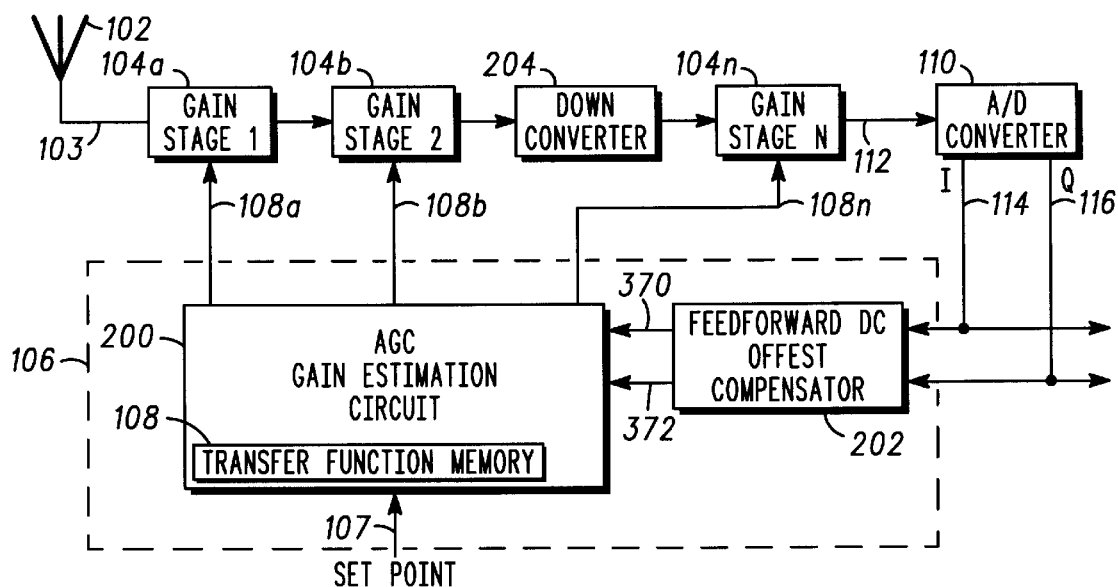
FIG. 2 is a block diagram illustrating one example of an automatic gain control apparatus in accordance with the invention.

FIG. 2 illustrates the portion of the receiver 100, wherein like reference numerals are used to designate the same blocks. As shown, the AGC circuit 106 includes an AGC gain estimation circuit 200 and a feedforward DC offset compensation circuit 202. The gain estimation circuit 200 is operatively coupled to the memory 108 and estimates the input power of the signal 112 using the digital signals 114 and 116 to determine a required gain for an input signal 103, based on a nonlinear (and linear) portion of an inverse transfer function stored in the memory 108. As known in the art, a frequency down converter 204 may also be used.

The feedforward DC compensation circuit 202 is operatively coupled between an output that provides signal 112 from the gain stage and an input to the gain estimation circuit 200. The feedforward DC offset compensation circuit 202 generates an in-phase digital error signal 360a (see FIG. 3A) and a quadrature phase DC error signal 360b to remove DC offsets introduced by the ADC or other sources. These signals are combined and subtracted from the signal. As further set forth below, the memory 108 contains data representing a transfer function of the radiotelephone receiver, and preferably includes an inverse of a transfer function of the radiotelephone receiver. In one embodiment, the data represents the inverse transfer function of the receiver and is in the form of a prestored lookup table.

In addition, the AGC gain estimation circuit 200 simultaneously adjusts the gain on all of the plurality of gain stages 104–104n based on the required gain for the input signal 103 as determined by the gain estimation circuit.

Figure 3A:
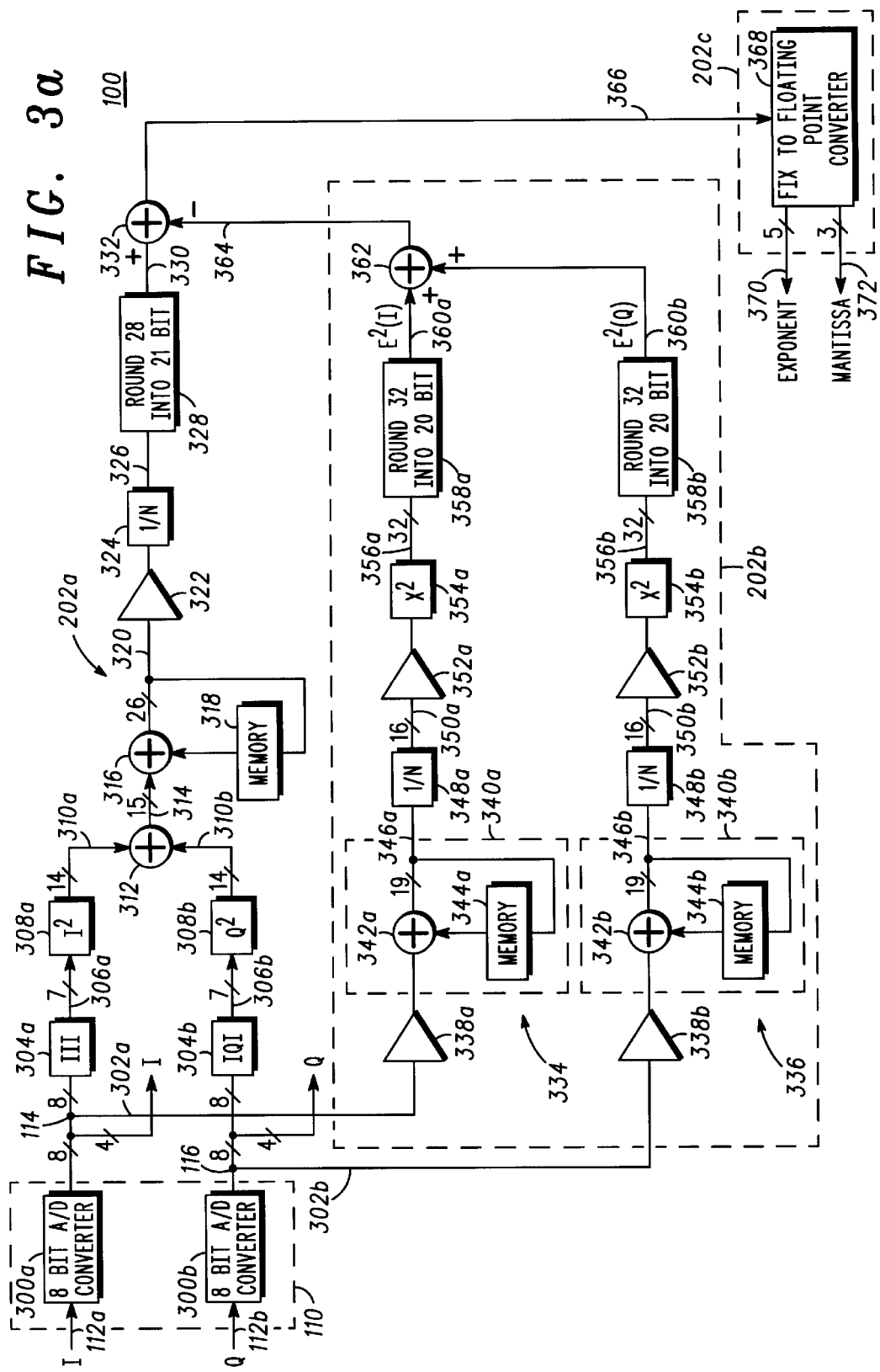
FIGS. 3A and 3B illustrate in more detail an example of an automatic gain control circuit with DC offset correction, in accordance with one embodiment of the invention.
Figure 3B:
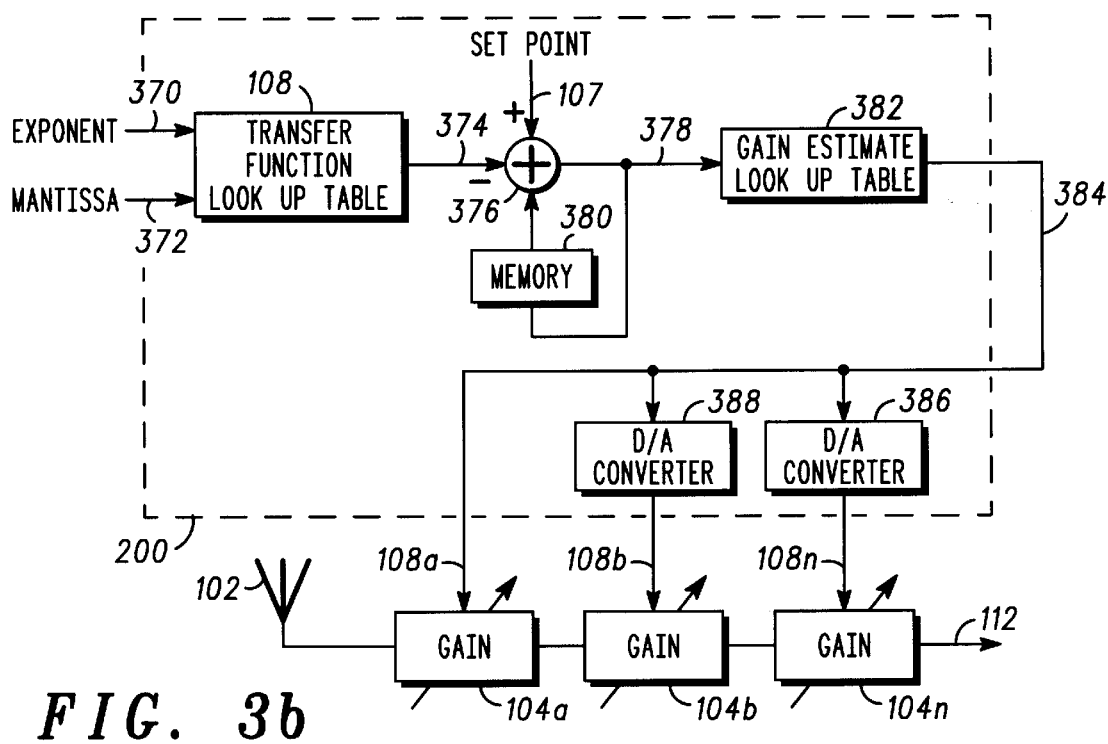

Referring to FIGS. 3A and 3B, the analog/digital converter 110 receives an in-phase analog signal 112a and a quadrature phase analog input signal 112b. One embodiment of the feedforward DC offset compensator 202 is broken down into block 202a, 202b and 202c as shown. The analog to digital converter 110 may include, for example, a pair of 8-bit analog to digital converters 300a and 300b. The 8-bit A/D converters 300a and 300b output a converted in-phase signal and a converted quadrature phase signal 302a and 302b, respectively. Absolute value stages 304a and 304b take the absolute value of the converted signals 302a and 302b and output, for example, a 7-bit output from an 8-bit converted input signal. The 7-bit absolute value signals 306a and 306b serve as input to squaring stages 308a and 308b which square the input and output a 14-bit squared in-phase signal 310a and a 14-bit quadrature phase signal 310b. Adder 312 adds the signals 310a and 310b and outputs the result including the carry bit in the form of summed output 314 to an adder 316. The adder 316 and memory 318 serve as an averaging stage with feedback. The adder 316 and memory 318 serve to average samples n×N (number of samples). The number of samples may be, for example, 1820 in one embodiment. The memory 318 stores the previous result of the adder 316 and adds the previous result with the new sample. The memory 318 is cleared each time the average value of the samples is determined. However, it will be recognized that any other suitable methods of accumulating samples may also be used. A resulting 26-bit value 320 is stored in buffer 322. A divide by N block 324 is used to obtain a per sample mean value 326.

The receiver 100 attempts to determine the power or variance according to, for example, the following formula:

$$POWER = \frac{1}{N}\sum_{n=1}^{N} x^2(n)$$

where x(n) is the input signal samples and where n=1,2, 3, ..., N.

The mean value 326 is determined according to the formula:

$$\bar{x} = E(x) = \frac{1}{N}\sum_{n=1}^{N} x(n)$$

A truncating block 328 truncates the mean value from a 28-bit value to a 21-bit value. In this embodiment, 21 bits allows up to 63 dB of dynamic range, which may be adequate for most applications. A truncated output mean value 330 serves as input to a subtractor 332. The truncated output mean value 330 is the rounded version of the expected value of the variance.

The feedforward DC offset compensator circuit 202 includes an in-phase DC compensation circuit 334 and a quadrature DC compensation circuit 336. Each of the feedforward DC compensation circuits 334 and 336 are substantially identical in operation. As shown, a buffer 338a and 338b receives and stores respective samples of a digitized in-phase signal and a quadrature phase signal 302a and 302b. Similar in operation to the summer 316 and memory 318, the feedforward DC offset compensation circuits 334 and 336 each include a summning stage 340a and 340b which includes a summer 342a and corresponding memory 344a for the in-phase signal, and summer 342b and memory 344b for the quadrature phase DC compensation circuit 336. These summing stages 340a and 340b obtain an average sum for N samples, such as for 1820 samples as noted above. A 19-bit sum value 346a and 346b are input to a divide by N stage 348a and 348b, respectively. The result is a 16-bit mean value 350a and 350b. These mean values 350a and 350b are stored in suitable buffers 352a and 352b. Squaring stages 354a and 354b receive the generated mean values 350a and 350b and perform a squaring operation, resulting in an in-phase squared result 356a and a quadrature squared result 356b. Each of these results is truncated into 20-bit results in truncators 358a and 358b. The result is a DC offset error 360a for the in-phase signal and a DC offset error 360b for the quadrature phase signal. These DC offset errors 360a and 360b are combined in an error combiner 362 and a net offset error 364 is subtracted in substractor 332 with the signal 330 to obtain a DC compensated input signal 366. The DC compensated input signal 366 is then passed through a fixed point to floating point converter 368 to provide a floating point output such as a 5-bit exponent value 370 and a 3-bit mantissa value 372.

The exponent value 370 and mantissa value 372 serve as indexes to the memory 108 containing the inverse transfer function of the receiver in the form of a transfer function lookup table. A corresponding automatic gain control value 374 serves as an input to the comparator 376 which compares a set point value 107 to the automatic gain control value 374 obtained from the transfer function lookup table. The comparator 376 effectively compares previous control values 378 that are stored in memory 380 with the set point value 107 and the automatic gain control value 374. Once the new gain control setting 378 is determined, it is used as an index for memory 382 that contains a gain assignment lookup table to set a gain control 384 for a plurality of gain stages 104a–104n. The gain assignment look up table is determined by the one or more gain stages 104a, 104b through 104n. In most applications the first stages have the largest amount of gain. This approach allows the best noise figure of the overall cascaded amplifier. For example if 104a is 0 or 32 dB gain stage, whenever the total gain is less than 32 dB it is set to 0 dB at the lookup table. However if the total gain is larger than 32 dB (say 34 db), the first stage is set to 32 dB and the next 2 dB is set by the lookup table to stage 104b, and so on. The gain control 384 is input to digital analog converters 386 and 388 simultaneously so that gain control is applied to all gain stages at the same time. This can effectively speed up the attenuation or amplification as necessary.

The comparator 376 is coupled to compare the automatic gain control value 374 which serves as a gain estimate, based on nonlinear data stored as inverse transfer function data. The gain estimate is compared to the set point data to determine the amount of adjustment 384 for a gain stage.

Since the inverse transfer function of the receiver is stored, when nonlinear response points of the receiver are detected, the lookup table accurately determines the appropriate gain control setting for the gain stages. The feedforward DC offset correction helps accurately estimate gain for low-level signals. When high power signals are detected, the nonlinear portion of the response of the receiver is still used to more accurately provide a gain estimation based on the inverse transfer function stored in memory 108. Accordingly, an improved dynamic range of the receiver is provided. The dynamic range of the receiver may increase, for example, from 60 to 70 dB.

The calibration of each branch may be performed during a manufacturing process to maintain a suitable I to Q ratio or the stored increase transfer function may be used to calibrate the receiver. The clock rate of the A/D converter should be chosen to adequately provide conversions based on the bandwidth of the incoming signal.

The structure for blocks described herein may be implemented in any suitable fashion. For example, memory elements and a suitably programmed digital signal processor, software, firmware, state machines, discrete logic or any other suitable structure may be used.

Figure 4A:
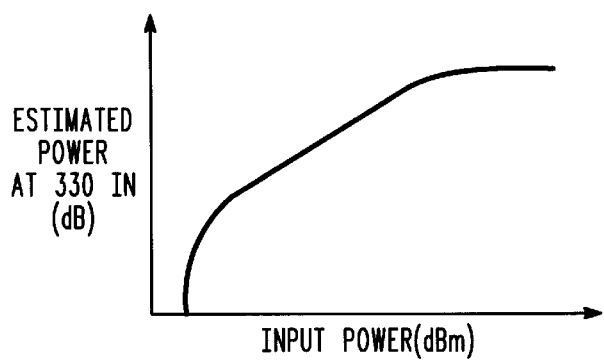
FIG. 4A is a diagram illustrating a transfer characteristic of a radiotelephone receiver.
Figure 4B:
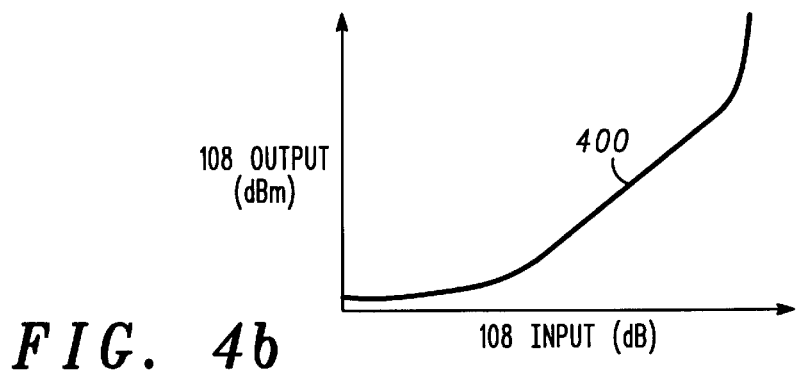
FIG. 4B is a diagram illustrating a gain response of one embodiment of the invention.

Referring to FIG. 4A, an example of a transfer characteristic curve is shown for the receiver 100. One example of the data representing a transfer function of the radio telephone receiver stored in the transfer function memory 108 is represented, for example in FIG. 4.2, as data 400 which shows the input-output inverse transfer function stored for a CDMA radio. When the gain estimation circuit receives digital data representing a power level along the nonlinear portions of the inverse transfer function, the lookup table contains associated gain estimation values for those nonlinear portions of the receiver. The gain estimation circuit then applies these nonlinear values to determine the appropriate gain savings for the plurality of gain stages.

One method for calibrating the apparatus shown in FIGS. 3A and 3B may be as follows. However, any suitable calibration method may be used. When receiving a CDMA input signal, a 1 MHz offset signal tuned to the lowest channel number may be injected into the receiver at a level of minus 110 dBm. The plurality of gain stages are set to give a nominal reading on an internal power meter. The power meter measures the complex power x=I+jQ at the input of 110, namely signals 112a and 112b. The power meter is digitally controlled to give a reading of $(I-Idc)^2 + (Q-Qdc)^2$ where I, Q are the 8 bit representation of a final analog voltage signal before digitization and Idc, Qdc are any DC offsets produced in the digitization process. i.e. a true power meter.

The value of the attenuator settings is stored temporarily as a function of the injected power level in another computing device. The process is repeated for 110 power levels at 1 dB resolution. The process may again be repeated for as many channels as necessary, such as twelve channels having channels spacing of 5 MHz. Lastly, the entire process is repeated for the desired temperature ranges, such as −20, 6, 30 and 60 degrees Celsius. Based on the stored attenuator values, a matrix of attenuator settings is interpolated in the processing device for 220 power levels, 12 channels and 16 temperatures. The matrix serves as the inverse transfer function of the receiver and is downloaded into the memory 108.

In operation, when a signal is received by the receiver, the power control circuit is brought to a nominal power level as measured by the internal power meter using the system attenuators, for example, the gain stages. Based on the known operating channel, the measured temperature and attenuator setting, an accurate measurement of the input power may be calculated from the calibration data or inverse transfer function data stored in memory. This determined power level or received signal strength indication value is then reported at a rate of approximately 625 microseconds to a receiver master controller, such a computer. It is coupled to access the results of 330, 332, 364, 368 and formally 370 and 372. It has access to the lookup tables 108 and 382, and calibrates these tables by saving the required data into the tables. The table has inputs which are similar to address input of a memory and outputs like data output of a computer memory.

It should be understood that the implementation of other variations and modifications of the invention in its various aspects will be apparent to those of ordinary skill in the art, and that the invention is not limited by the specific embodiments described. It is therefore contemplated to cover by the present invention, any and all modifications, variations, or equivalents that fall within the spirit and scope of the basic underlying principles disclosed and claimed herein.

What is claimed is:

1. An automatic gain control apparatus for a radiotelephone receiver comprising:

memory containing data representing a transfer function of the radio telephone receiver;

a gain estimation circuit, operatively coupled to the memory, that estimates input power and determines a required gain for an input signal based on a non-linear portion of the data representing the transfer function; and a DC offset compensation circuit operatively coupled to the gain estimation circuit, the DC offset compensation circuit comprising:

a circuit for calculating a mean value of the signal having an in-phase (I) component and a quadrature (Q) component;

an in-phase DC compensation circuit for calculating a DC offset error for the I component;

a quadrature DC compensation circuit for calculating a DC offset error for the Q component, wherein the DC offset error for the I component and the DC offset error for the Q component are subtracted from the mean value of the signal; and a first analog to digital converter coupled to the circuit for calculating a mean value of the signal, wherein the first analog to digital converter receives the I component and produces a first digital I component containing 8 bits and a second digital I component containing 4 bits and wherein the 4 bits are a subset of the 8 bits.

2. The apparatus of claim 1 wherein the data representing the transfer function of the radio telephone receiver includes data representing an inverse of a transfer function of the radiotelephone receiver.

3. The apparatus of claim 2 wherein the data representing the inverse of the transfer function is in the form of a pre-stored table.

4. The apparatus of claim 1 including a plurality of gain stages and wherein the gain estimation circuit simultaneously adjusts the gain on all of the plurality of stages based on the required gain for the input signal.

5. The apparatus of claim 4 including memory containing a gain assignment look up table to set a gain control for each of the plurality of gain stages.

6. The apparatus of claim 1 including a comparator operatively coupled to compare a gain estimate based on the non-linear data from memory, to set point data to determine an amount of adjustment for a gain stage.

7. The automatic gain control apparatus of claim 1 wherein the DC offset compensation circuit further comprises a second analog to digital converter coupled to the circuit for calculating a mean value of the signal, wherein the second analog to digital converter receives the Q component and produces a first digital Q component containing 8 bits and a second digital Q component containing 4 bits and wherein the 4 bits are a subset of the 8 bits.

8. The automatic gain control apparatus of claim 1 wherein the 4 bits are a center 4 bits of the 8 bits.

9. The automatic gain control apparatus of claim 1 wherein the circuit for calculating the mean value of the signal comprises:
   a first squaring stage for producing a first squared value of the I component of the signal;
   a second squaring stage for producing a second squared value of the Q component of the signal;
   a first summer for adding the first and second squared values;
   a memory for storing a sum of the first and second squared values; and
   a circuit for computing a mean value of the sum of the first and second squared values for a predetermined amount of samples of the signal.

10. The automatic gain control apparatus of claim 9 further comprising:
    a first absolute value stage coupled to the first squaring stage for producing an absolute value of the I component; and
    a second absolute value stage coupled to the second squaring stage for producing an absolute value of the Q component.

11. The automatic gain control apparatus of claim 1 wherein the in-phase DC compensation circuit comprises:
    a memory for storing samples of the I component;
    a summer coupled to the memory for adding contents of the memory to a current I component sample;
    a circuit for computing a mean value of the I component samples for a predetermined amount of samples of the signal; and
    a squaring stage for squaring the mean value of the I component, thereby producing the DC offset error for the I component.

12. The automatic gain control apparatus of claim 1 wherein quadrature DC compensation circuit comprises:
    a memory for storing samples of the Q component;
    a summer coupled to the memory for adding contents of the memory to a current Q component sample;
    a circuit for computing a mean value of the Q component samples for a predetermined amount of samples of the signal; and
    a squaring stage for squaring the mean value of the Q component, thereby producing the DC offset error for the Q component.

13. Automatic gain control method for a radiotelephone receiver comprising the steps of:
    storing data representing a transfer function of the radio telephone receiver;
    converting the I component to a first digital I component containing 8 bits and a second digital I component containing 4 bits, wherein the 4 bits are a subset of the 8 bits;
    converting the Q component to a first digital Q component containing 8 bits and a second digital Q component containing 4 bits, wherein the 4 bits are a subset of the 8 bits;
    calculating a mean value of an input signal having an in-phase (I) component and a quadrature (Q) component; calculating a DC offset squared error for the I component; calculating a DC offset squared error for the Q component, subtracting the DC offset squared error for the I component and the DC offset error for the Q component from the mean value of the input signal; and
    estimating input power and determining a required gain for the input signal based on a non-linear portion of the data representing the transfer function.

14. The method of claim 13 wherein the data representing the transfer function of the radio telephone receiver includes data representing an inverse of the transfer function.

15. The method of claim 14 wherein the data representing the inverse of the transfer function is in the form of a table.

16. The method of claim 13 including the step of simultaneously adjusting the gain on all of the plurality of stages based on the required gain for the input signal.

17. The method of claim 16 including storing a gain assignment look up table to set a gain control for each of the plurality of gain stages.

18. The method of claim 13 including the step of comparing a gain estimate based on the non-linear data from memory, to set point data to determine an amount of adjustment for a gain stage.

19. The method of claim 13 wherein the step of calculating a mean value of the signal comprises:
    producing a first squared value of the I component of the signal;
    producing a second squared value of the Q component of the signal;
    summing the first and second squared values to produce a first sum;
    adding the first sum to contents of a memory to produce a second sum;
    storing the second sum in the memory;
    repeating the above steps for a predetermined amount of samples of the signal; and
    computing a mean value of the second sum for the predetermined amount of samples of the signal.

20. The method of claim 13 wherein the step of calculating a DC offset error for the I component comprises:
    adding a current I component to contents of a memory to produce a first sum;
    storing the first sum in the memory;
    repeating the above steps for a predetermined amount of samples of the signal;
    computing a mean value for the first sum for the predetermined amount of samples of the signal; and squaring the mean value of the first sum, thereby producing the DC offset error for the I component.

21. The method of claim 13 wherein the step of calculating a DC offset error for the Q component comprises:

adding a current Q component to contents of a memory to produce a first sum;

storing the first sum in the memory;

repeating the above steps for a predetermined amount of samples of the signal;

computing a mean value for the first sum for the predetermined amount of samples of the signal; and squaring the mean value of the first sum, thereby producing the DC offset error for the Q component.

* * * * *